United States Patent
Sun et al.

(10) Patent No.: US 11,855,656 B2
(45) Date of Patent: Dec. 26, 2023

(54) DETECTION CIRCUIT AND DETECTION METHOD, ELECTRONIC DEVICE, AND COMPUTER-READABLE STORAGE MEDIUM

(71) Applicant: Changxin Memory Technologies, Inc., Anhui (CN)

(72) Inventors: Yuanyuan Sun, Hefei (CN); Jia Wang, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 0 days.

(21) Appl. No.: 17/843,476

(22) Filed: Jun. 17, 2022

(65) Prior Publication Data

US 2023/0216524 A1  Jul. 6, 2023

(30) Foreign Application Priority Data

Dec. 30, 2021 (CN) .......................... 202111653054.4

(51) Int. Cl.
*H03M 13/11* (2006.01)
*H03M 13/00* (2006.01)

(52) U.S. Cl.
CPC ...... *H03M 13/1111* (2013.01); *H03M 13/611* (2013.01)

(58) Field of Classification Search
CPC .......................... H03M 13/1111; H03M 13/611
See application file for complete search history.

(56) References Cited

U.S. PATENT DOCUMENTS

| | | | | |
|---|---|---|---|---|
| 7,272,775 B2* | 9/2007 | Jacquet | ............... | G06F 11/1008 714/E11.049 |
| 2006/0171202 A1* | 8/2006 | Kawamoto | ........ | G11C 16/0483 365/185.17 |
| 2006/0242451 A1* | 10/2006 | Ausserlechner | .... | G06F 11/1008 714/1 |
| 2021/0294527 A1* | 9/2021 | Aiba | ................... | G11C 11/1693 |
| 2022/0122685 A1* | 4/2022 | Ahn | ....................... | G11C 29/14 |

FOREIGN PATENT DOCUMENTS

CN          102279776 B      6/2015

* cited by examiner

*Primary Examiner* — Thien Nguyen
(74) *Attorney, Agent, or Firm* — Sheppard Mullin Richter & Hampton LLP

(57) ABSTRACT

The invention relates to a detection circuit, a detection method, an electronic device, and a computer-readable storage medium. The detection circuit includes: an error correction coding module configured to obtain data to be checked, and perform, based on an error correction coding logic, error correction coding on the data to be checked, to output target coded data; a data mask interface configured to receive comparison coded data, where the comparison coded data is associated with ideally coded data of the data to be checked; a comparison checking module configured to perform a checking comparison on the target coded data and the comparison coded data to output a checking comparison result; and a logic verification module configured to determine a coding verification result of the error correction coding module based on the checking comparison result. The comparison checking data verifies correctness of the error correction coding logic.

18 Claims, 4 Drawing Sheets

DETECTION CIRCUIT AND DETECTION METHOD, ELECTRONIC DEVICE, AND COMPUTER-READABLE STORAGE MEDIUM

CROSS-REFERENCE TO RELATED APPLICATION

This application claims priority to Chinese Patent Application No. 202111653054.4, filed with the China National Intellectual Property Administration on Dec. 30, 2021 and entitled "DETECTION CIRCUIT AND DETECTION METHOD, ELECTRONIC DEVICE, AND COMPUTER-READABLE STORAGE MEDIUM." The above-referenced application is incorporated herein by reference in its entirety.

TECHNICAL FIELD

This invention relates to the technical field of semiconductors, and specifically to a detection circuit, a detection method, an electronic device, and a computer-readable storage medium.

BACKGROUND

A dynamic random access memory (DRAM) is a type of semiconductor memory, the main working principle of which is interpreting presence or absence of a charge stored in a capacitor as a binary bit of 1 or 0, respectively. Due to a leakage current in a transistor, in reality, a charge stored in a capacitor can change over time which can lead to data corruption. Further, the charge, by itself, is not enough to correctly identify data stored in the capacitor.

In a DRAM, an error checking and correction (ECC) technology is introduced to detect and correct errors in data, so as to effectively reduce one-bit random errors in an array.

It should be noted that information disclosed in the background section is used merely for a better understanding of the background of the invention, and therefore may include information that does not constitute prior art known to persons of ordinary skill in the art.

SUMMARY

An objective of this invention is to provide a detection circuit, a detection method, an electronic device, and a computer-readable storage medium, that overcome, at least to a certain extent, problems of needing additional resource and time consumption in separate verification to check for correctness of a comparison checking circuit and data due to a failure of an existing solution of writing data to an ECC array.

Other features and advantages of the invention will be apparent from the following detailed description, or is learned in part by practicing the invention.

According to a first aspect of the invention, a detection circuit of a memory module, such as a random access memory (RAM) module, is provided. The detection circuit includes: an error correction coding module configured to obtain data to be checked, and perform, based on an error correction coding logic, error correction coding on the data to be checked, to output target coded data; a data mask interface configured to receive comparison coded data, where the comparison coded data is ideally coded data of the data to be checked; a comparison checking module configured to perform a checking comparison on the target coded data and the comparison coded data to output a checking comparison result; and a logic verification module configured to determine a coding verification result of the error correction coding module based on the checking comparison result.

In an example embodiment of the invention, the detection circuit further includes a data obtaining module configured to obtain external original data through a data transmission interface, and replicate the external original data to generate the data to be checked, where the data to be checked has a preset length.

In an example embodiment of the invention, the error correction coding module further includes an error correction coding unit configured to: perform, based on the error correction coding logic, error correction coding on the data to be checked to obtain a corresponding target row checking code and a corresponding target column checking code; and generate the target coded data based on the target row checking code and the target column checking code.

In an example embodiment of the invention, the detection circuit further includes a comparison data generation module configured to: obtain comparison checking data, where a parameter of the comparison checking data is same as a parameter of the data to be checked; and perform error correction coding on the comparison checking data based on the error correction coding logic, to obtain the comparison coded data.

In an example embodiment of the invention, the comparison data generation module is further configured to: obtain single-byte data, and determine a target quantity of replication times of the single-byte data based on the preset length of the data to be checked; and replicate the single-byte data for the target quantity of replication times, to obtain the comparison checking data.

In an example embodiment of the invention, the comparison checking module includes a comparison checking unit configured to: perform consistency checking on the target coded data and the comparison coded data, to output a flag signal for representing the checking comparison result; if the target coded data is consistent with the comparison coded data, determine the checking comparison result as a first comparison result, and output, by the comparison checking unit, a first flag signal; and if there is a difference between the target coded data and the comparison coded data, determine the checking comparison result as a second comparison result, and output, by the comparison checking unit, a second flag signal.

In an example embodiment of the invention, the target coded data includes a target row checking code and a target column checking code, and the comparison coded data includes a comparison row checking code and a comparison column checking code; and the comparison checking module is configured to: perform, by the comparison checking unit, a bitwise consistency comparison on the comparison row checking code and the corresponding target row checking code, to output a row comparison result; perform, by the comparison checking unit, a bitwise consistency comparison on the comparison column checking code and the corresponding target column checking code, to output a column comparison result; and generate the checking comparison result based on the row comparison result and the column comparison result.

In an example embodiment of the invention, the detection circuit further includes a data writing module configured to: when the comparison checking circuit outputs the first flag signal, write the target coded data to an error correction coding array to generate array checking data, where the array checking data is used to check the data to be checked that is stored in a data array.

In an example embodiment of the invention, the logic verification module includes a first verification unit configured to: receive the second flag signal, and determine, under excitation of the second flag signal, whether the data to be checked is coded same as the ideally coded data of the data to be checked.

In an example embodiment of the invention, the logic verification module includes a second verification unit configured to: if the data to be checked is incorrect, perform data recovery on the data to be checked that is to be coded, to obtain recovered checking data; perform error correction coding on the recovered checking data, to update the target coded data; and perform logic checking based on the updated target coded data, to output a logic verification result.

According to a second aspect of the invention, a detection method is provided, including: obtaining data to be checked, and performing, based on an error correction coding logic, error correction coding on the data to be checked, to output target coded data; receiving comparison coded data obtained by a data mask interface, where the comparison coded data is ideally coded data of the data to be checked; performing a checking comparison on the target coded data and the comparison coded data, to output a checking comparison result; and determining a coding verification result of the error correction coding logic based on the checking comparison result.

According to a third aspect of the invention, an electronic device is provided, including: a processor; and a memory storing computer-readable instructions stored thereon, where when the computer-readable instructions are executed by the processor, the detection method described above is performed.

According to a fourth aspect of the invention, a computer-readable storage medium having a computer program stored thereon is provided, where when the computer program is executed by a processor, the detection method described above is performed.

The technical solutions provided in the invention may include the following beneficial effects:

According to the detection method in the example embodiment of the invention, the comparison coded data is directly obtained through the data mask interface, and such a data obtaining method is simpler and more efficient than obtaining data from an error checking and correction array and a storage area. In addition, correctness of the error correction coding logic is determined based on the checking comparison result of the target coded data and the comparison coded data, so that the correctness of the error correction coding logic in the error correction coding module can be tested quickly, which ensures that the target coded data generated by the error correction coding module can be effectively used for data error correction, and thereby improving efficiency of data reading and writing.

It should be understood that the above general description and the following detailed description are only exemplary and explanatory, and should not be construed as a limitation to the invention.

BRIEF DESCRIPTION OF THE DRAWINGS

The accompanying drawings, which are incorporated into and constitute a part of the description, illustrate the embodiments of the invention and together with the description, serve to explain the principles of the invention. Apparently, the accompanying drawings in the following description show merely some embodiments of the invention, and persons of ordinary skill in the art may still derive other drawings from these accompanying drawings without creative efforts. In the accompanying drawings.

DETAILED DESCRIPTION OF EMBODIMENTS

Figure 1:
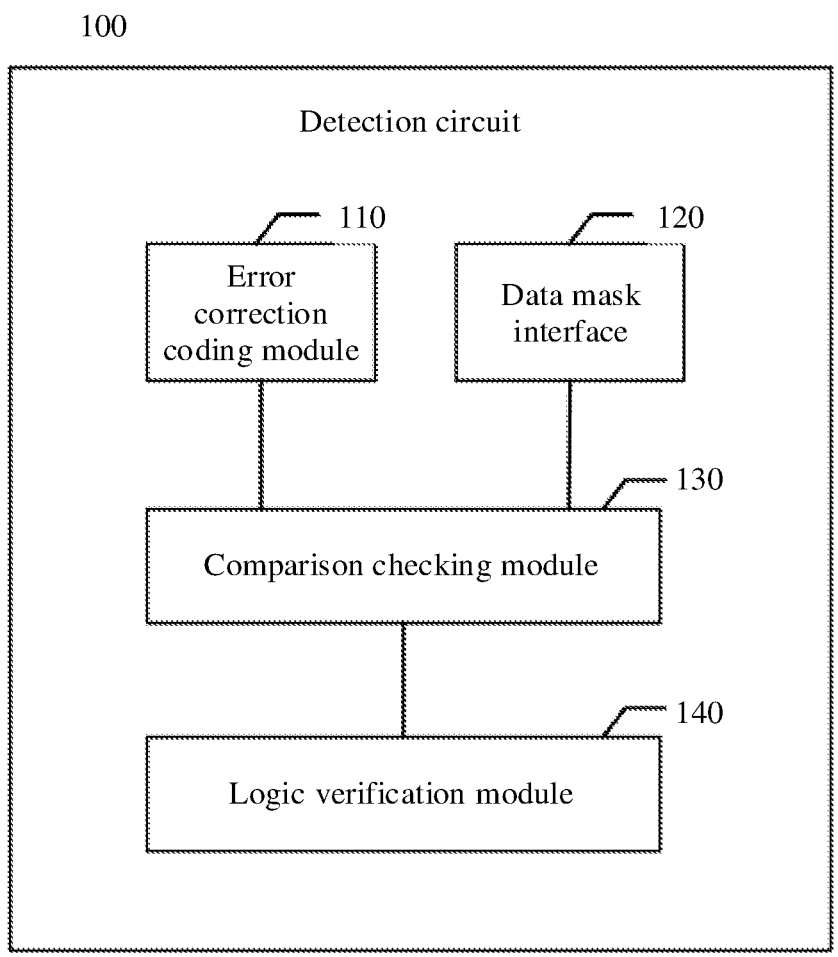
FIG. 1 schematically shows a block diagram of a detection circuit according to an example embodiment of the invention.

Example embodiments will now be described in further detail with reference to the accompanying drawings. The example embodiments can be implemented in various ways and should not be construed as being limited to the embodiments described herein. The example embodiments are provided such that the invention is comprehensive and complete, and fully convey the concept of the example embodiments to persons skilled in the art. Identical reference numerals in the accompanying drawings denote identical or similar parts. Therefore, repeated description thereof will be omitted.

In addition, features, structures, or characteristics described herein may be incorporated into one or more embodiments in any suitable manner. In the following description, many specific details are provided to give a full understanding of the embodiments of the invention. However, persons skilled in the art will be aware that the technical solutions of the invention may be practiced without one or more of the specific details; or other methods, components, apparatuses, steps, etc., may be used. In other cases, publicly known structures, methods, devices, implementations, materials, or operations are not illustrated or described in detail, so as to avoid obscuring various aspects of the invention.

The block diagrams shown in the accompanying drawings are merely functional entities, and do not necessarily correspond to physically independent entities. In other words, these functional entities may be implemented in the form of software, or these functional entities or parts of the functional entities are implemented in one or more software hardened modules, or these functional entities are implemented in different networks and/or processor apparatuses and/or microcontroller apparatuses.

Error checking and correction (ECC) is developed on the basis of parity checking. A parity memory adds one parity bit to original data bits to check for correctness of the original data bits. In integrated circuit chip (IC chip) design, output signals of a RAM module include a parity signal and an ECC signal. The parity signal indicates whether data written to the RAM module is consistent with data read. The ECC signal may be responsible for error correction and can correct 1-bit data.

There are currently two methods for writing data to an error checking and correction array (ECC Array). One method is to decode external 128-bit data to generate values of corresponding 8 ECC parity bits. The 128-bit data is written to a main array, and the 8 ECC parity bits are written to an ECC array. Any bit to which a decoding pointer points is an error bit, thereby achieving a function of locating and error correction. The other method is mainly to read values in an ECC array for back-end testing without error correction. A compression write module writes 128-bit data to each storage area (e.g., column plane), and data in each column plane is the same. In this case, the ECC array replicates data in column plane 7/column plane 8, and the replicated data in the ECC array can be read out in later testing and is mainly used to determine whether there is any error in the main array. However, in the foregoing method, if an error occurs in the data, and an encoder circuit also has an error, the error cannot be determined until a reading phase.

Based on this, in this example embodiment, a detection circuit 100 of a random access memory (RAM) is first provided. FIG. 1 schematically shows a block diagram of the detection circuit 100 according to an example embodiment of the invention. In some embodiments, the detection circuit 100 can implemented as a part of the ECC array described above. Referring to FIG. 1, the detection circuit 100 may include following components:

an error correction coding module 110 configured to obtain data to be checked, and perform, based on an error correction coding logic, error correction coding on the data to be checked, to output target coded data;

a data mask interface 120 configured to receive comparison coded data, where the comparison coded data is associated with ideally coded data of the data to be checked. In some embodiments, the data mask interface 120 is a data mask (DM) pad of the RAM. In some embodiments, the comparison coded data may be an expected parity of the data to be checked;

a comparison checking module 130 configured to perform a checking comparison on the target coded data and the comparison coded data to output a checking comparison result; and a logic verification module 140 configured to determine a coding verification result of the error correction coding module 110 based on the checking comparison result.

According to the detection circuit 100, in this example embodiment, the comparison coded data is directly obtained through the data mask interface 120, and such a data obtaining method is simpler and more efficient than obtaining data from an error checking and correction (ECC) array and a storage area. In addition, correctness of the error correction coding logic is determined based on the checking comparison result of the target coded data and the comparison coded data, so that the correctness of the error correction coding logic in the error correction coding module 110 can be tested quickly, which ensures that the target coded data generated by the error correction coding module 110 can be used effectively for data error correction, and improves efficiency of data reading and writing.

The detection circuit 100 in this example embodiment will be further described below.

The error correction coding module 110 is configured to obtain data to be checked, and perform, based on an error correction coding logic, error correction coding on the data to be checked, to output target coded data.

In an example embodiment of the invention, the data to be checked is original data externally obtained from the detection circuit 100 and checked for correctness; the error correction coding logic is a set of coding rules for error correction coding on the original data. The error correction coding logic may be set in the error correction coding module 110; and the error correction coding is a process of performing error correction coding on the data to be checked to perform data error correction. The target coded data may be coded data generated after the error correction coding is performed on the data to be checked. In some embodiments, the target coded data may be a truth parity of the data to be checked.

Referring to FIG. 1, before performing detection, the detection circuit 100 may first obtain the data to be checked, and perform, by using the error correction coding module 110, error correction coding on the data to be checked. Specifically, to implement error correction coding for the data to be checked, an error correction logic unit may be pre-arranged in the error correction coding module 110, where the error correction logic unit may be a circuit that performs a logical operation such as error correction coding on the data to be checked, and the error correction logic unit performs error correction coding on the data to be checked, to output the target coded data.

In an example embodiment of the invention, the detection circuit 100 further includes a data obtaining module configured to obtain external original data through a data transmission interface, and replicate the external original data to generate the data to be checked, where the data to be checked has a preset length (e.g., a preset bit length).

The data transmission interface may be a transmission interface, such as a bidirectional data bus or a data (i.e., DQ) pad of the RAM, for obtaining the external original data. The external original data may be original data stored externally to the detection circuit 100. The preset length may be a length of the data to be checked that is pre-specified for circuit detection.

Figure 2:
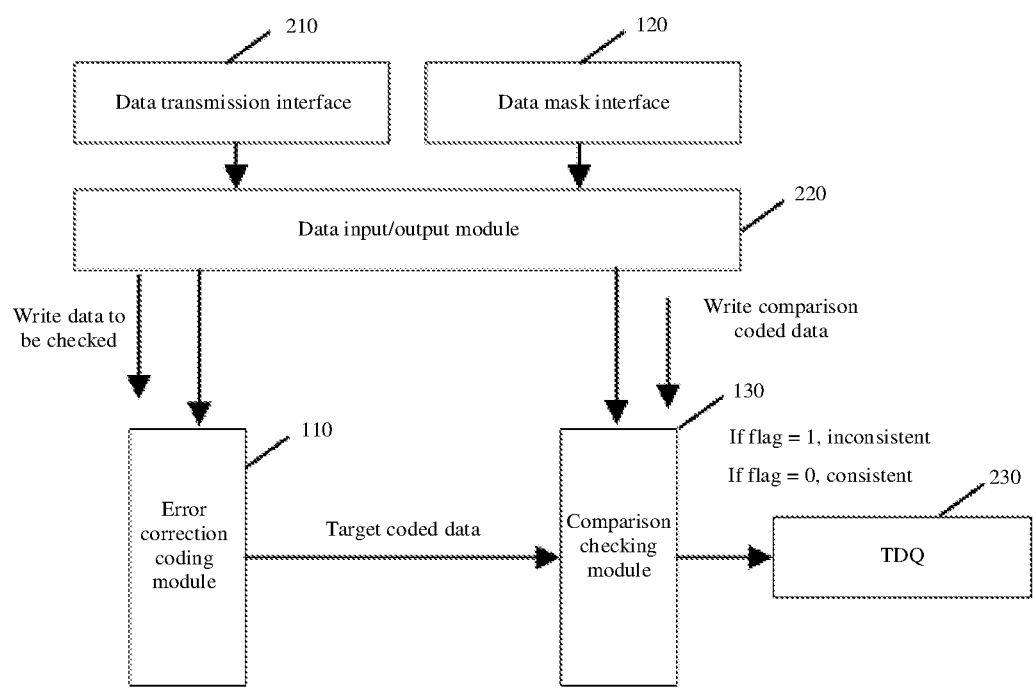
FIG. 2 schematically shows a data flow diagram of the detection circuit according to an example embodiment of the invention.

The detection circuit 100 may use the data obtaining module to obtain the data to be checked. Referring to FIG. 2, FIG. 2 schematically shows a data flow diagram of the detection circuit 100 according to an example embodiment of the invention. The data obtaining module may obtain external original data through a data transmission interface 210 (e.g., a DQ pad). The external original data may be stored in a pre-defined data storage area. For example, the external original data may be single-byte data, that is, the external original data having a length of 8 bits. After obtaining the external original data, the data obtaining module may perform a data replication operation based on the external original data according to the preset length of the data to be checked, to generate the data to be checked, where the data to be checked has a preset length. For example, the length of the data to be checked may be 128 bits. Since the length of the external original data is 8 bits, 15 replication operations are performed to obtain the 128-bit data to be checked. The data to be checked is obtained and then may be written by a data input/output module 220 to the error correction coding module 110.

Persons skilled in the art easily understand that, in other example embodiments, respective data lengths of the external original data and the data to be checked, and a source of the external original data may be determined based on specific checking requirements. This is not specifically limited in the invention.

In an example embodiment of the invention, the error correction coding module 110 includes an error correction coding unit configured to: perform, based on an error correction coding logic, error correction coding on the data to be checked to obtain a corresponding target row checking code and a corresponding target column checking code; and generate the target coded data based on the target row checking code and the target column checking code.

The target row checking code may be data obtained by coding row data corresponding to the data to be checked. The target column checking code may be data obtained by the coding column data corresponding to the data to be checked.

Still referring to FIG. 2, in the invention, the error correction coding logic preconfigured in the error correction coding module 110 is used to perform error correction coding on the data to be checked. For example, the error correction coding logic may be configured to use an ECC algorithm to perform error correction coding on the data to be checked.

In this embodiment, the error correction coding logic performs the error correction coding based on the ECC algorithm, to generate the target row checking code and the target column checking code corresponding to the data to be checked. After the target row checking code and the target column checking code are both obtained, the target coded data may be generated based on the target row checking code and the target column checking code.

The data mask interface 120 is configured to receive comparison coded data, where the comparison coded data is associated with ideally coded data of the data to be checked. In some embodiments, the comparison coded data may be an expected parity of the data to be checked.

In an example embodiment of the invention, the comparison coded data may be coded data obtained by using the error correction coding logic to perform error correction coding on comparison checking data obtained from outside, and the comparison coded data may be used as a basis for determining whether the target coded data is correct, that is, the comparison coded data is considered to be correct coded data for reference and comparison.

Referring back to FIG. 1, when the detection circuit 100 performs error correction coding on the data to be checked to output the target coded data, the comparison coded data may be received through the data mask interface 120, and the comparison coded data is written to the comparison checking module 130.

In an example embodiment of the invention, the detection circuit 100 further includes a comparison data generation module configured to: obtain the comparison checking data, where a parameter of the comparison checking data is same as a parameter of the data to be checked; and perform error correction coding on the comparison checking data based on the error correction coding logic, to obtain the comparison coded data. The comparison checking data and the data to be checked may be obtained in different manners. It should be noted that the comparison data generation module may reside internally or externally to the RAM. When the comparison data generation module resides externally to the RAM, the detection circuit 100 of the RAM receives the generated comparison coded data through the data mask interface 120.

To verify correctness of the error correction coding logic, the comparison coded data for data comparison with the target coded data further needs to be determined. A specific process of obtaining the comparison coded data is as follows: first obtaining the comparison checking data, and after the comparison checking data is obtained, performing error correction coding on the comparison checking data, where the error correction coding logic used for performing error correction coding on the comparison checking data is same as an ideal error correction coding logic in the error correction coding module.

In an example embodiment of the invention, the comparison data generation module is further configured to: obtain single-byte data, and determine a target quantity of replication times of the single-byte data based on the preset length of the data to be checked; and replicate the single-byte data for the target quantity of replication times, to obtain the comparison checking data.

The comparison checking data may be generated based on the single-byte data. For example, the single-byte data may be obtained from a pre-defined data storage area, which may be, for example, a column plane. In this case, the single-byte data, i.e., 8-bit data, may be obtained from the column plane. After the single-byte data is obtained, the preset length of the data to be checked may be determined. For example, the preset length may be 128 bits, 256 bits, or the like. The target quantity of replication times of the single-byte data may be determined based on the preset length of the data to be checked. For example, if the preset length of the data to be checked is 128 bits, the target quantity of replication times of the single-byte data is 15. After the target quantity of replication times is determined, the single-byte data may be replicated for the target quantity of replication times, to obtain the comparison checking data.

It should be noted that the data to be checked may be generated in the same manner as the comparison checking data, which is not described in detail in the invention.

In an example embodiment of the invention, the detection circuit 100 further includes a driving module configured to: write the obtained comparison coded data to the comparison checking module 130 to perform a checking comparison.

After the comparison checking data is obtained, the comparison coded data may be written by the driving module to the comparison checking module 130. The driving module may reside in the data input/output module 220. Still referring to FIG. 2, the data input/output module 220 in FIG. 2 writes the comparison coded data to the comparison checking module 130 to perform a checking comparison.

The comparison checking module 130 is configured to perform a checking comparison on the target coded data and the comparison coded data to output a checking comparison result.

In an example embodiment of the invention, the checking comparison result may be a result of determining whether the target coded data and the comparison coded data are consistent after the checking comparison is performed.

After the target coded data and the comparison coded data are written to the comparison checking module 130, the checking comparison may be performed based on a data consistency comparison checking processing logic configured in the comparison checking module 130, and a corresponding consistency comparison result is obtained.

In an example embodiment of the invention, the comparison checking module 130 includes a comparison checking unit configured to: perform consistency checking on the target coded data and the comparison coded data, to output a flag signal for representing the checking comparison result; if the target coded data is consistent with the comparison coded data, determine the checking comparison result as a first comparison result, and output a first flag signal, that is, flag=0; and if there is a difference between the target coded data and the comparison coded data, determine the checking comparison result as a second comparison result, and output a second flag signal, that is, flag=1.

In an example embodiment of the invention, the target coded data includes a target row checking code and a target column checking code, and the comparison coded data includes a comparison row checking code and a comparison column checking code; and the comparison checking module 130 is configured to: perform a bitwise consistency comparison on the comparison row checking code and the corresponding target row checking code, to output a row comparison result; perform a bitwise consistency comparison on the comparison column checking code and the corresponding target column checking code, to output a column comparison result; and generate the checking comparison result based on the row comparison result and the column comparison result.

After the error correction coding is performed, the target coded data and the comparison coded data both contain multi-bit data. For example, the target coded data may include the target row checking code and the target column checking code, and the comparison coded data includes the comparison row checking code and the target column checking code. For example, after the data to be checked is coded based on the ECC algorithm, the target coded data may include a 6-bit target column checking code, a 16-bit target row checking code, and two redundant set-to-1 bits. Similarly, the comparison coded data is generated by using the same error correction coding logic, to obtain the comparison row checking code and the comparison column checking code having same quantity of bits as those of the target coded data.

After the coded data is obtained, a bitwise consistency comparison is performed on the comparison row checking code and the corresponding target row checking code. For example, a bitwise consistency comparison is performed on the 6-bit comparison column checking code and the corresponding 6-bit target column checking code, to output a column comparison result. In addition, a bitwise consistency comparison is performed on the 16-bit comparison row checking code and the corresponding 16-bit target row checking code, to output a row comparison result. Moreover, a consistency comparison may be performed on the redundant parity bits. Finally, the checking comparison result is generated based on the row comparison result, the column comparison result, and a comparison result of the redundant padding bits.

The logic verification module 140 is configured to determine a coding verification result of the error correction coding module 110 based on the checking comparison result.

In an example embodiment of the invention, the coding verification result may be a correctness verification result of the error correction coding logic, and the coding verification result includes two cases: the error correction coding logic is correct, or the error correction coding logic is incorrect.

Based on the output comparison result of the target coded data and the comparison coded data, the correctness of the error correction coding logic may further be determined, to output a logic verification result. For example, if the checking comparison result is the first comparison result, it is determined that the target coded data and the comparison coded data are consistent. Therefore, it may be considered that the error correction coding logic in the error correction coding module 110 is correct. If the checking comparison result is the second comparison result, it is determined that the target coded data and the comparison coded data are inconsistent, which may be caused by an error during data transmission or an incorrect error correction coding logic. In this case, data correctness needs to be further verified.

In an example embodiment of the invention, the detection circuit 100 further includes a data writing module configured to: when the first flag signal is received, write the target coded data to an error correction coding array to generate array checking data, where the array checking data is used to check the data to be checked that is stored in a data array.

The error correction coding array may be a checking and correction array storing the target coded data. For example, the error correction coding array may be an ECC array. The array checking data may be data generated after the target coded data is written to the error correction coding array.

Referring to FIG. 2, to be specific, when the comparison checking module 130 outputs a flag signal=0, the flag signal may be read out from a transient data queue (TDQ) 230. When the flag signal is received, that is, when the flag signal=0, the target coded data may be considered consistent with the comparison coded data, and the error correction coding logic is correct. In addition, the target coded data is written to the error correction coding array to generate the array checking data. The generated array checking data may be used to check the data to be checked that is stored in the data array, to further determine correctness of the data to be checked.

In an example embodiment of the invention, the logic verification module 140 includes a first verification unit configured to: receive the second flag signal, and determine, under excitation of the second flag signal, whether the data to be checked is coded the same as the ideally coded data of the data to be checked.

When the second flag signal is received, still referring to FIG. 2, to be specific, when the comparison checking module 130 outputs the second flag signal, the second flag signal may be input to the TDQ 230. When the TDQ 230 receives the second flag signal, under excitation of the second flag signal, the first verification unit is triggered to verify whether the data to be checked is coded the same as the ideally coded data of the data to be checked. If the data to be checked is coded the same as the ideally coded data of the data to be checked, it is considered that the received data to be verified is correct. If the data to be checked is coded different from the ideally coded data of the data be checked, it is considered that the received data to be checked is incorrect, which may be caused by an error in the data itself or an error during data transmission.

In an example embodiment of the invention, the logic verification module includes a second verification unit configured to: if the data to be checked is incorrect, perform data recovery on the data to be checked that is to be coded, to obtain recovered checking data; perform error correction coding on the recovered checking data, to update the target coded data; and perform logic checking based on the updated target coded data, to output a logic verification result.

Data recovery may be a processing process of performing error correction and recovery on the data to be checked that is waiting for error correction coding. The recovered checking data may be data obtained after data recovery is performed on the data to be checked.

If it is determined that the data to be checked is incorrect, data recovery may be performed on the data to be checked that is to be coded, that is, data correction and recovery is performed on the data to be checked, to obtain the recovered checking data. After the recovered checking data is obtained, the error correction coding logic may still be used to perform error correction coding on the recovered checking data to generate new coded data, and the newly generated coded data is used as the updated target coded data. Logic checking is performed based on the updated target coded data, to output a logic verification result.

If an error occurs in the data to be checked, and the error correction coding logic is also incorrect, a data error cannot be determined until a reading phase. According to the foregoing detection method, the error correction coding logic can be quickly tested, thereby avoiding an error rate of data error correction and improving efficiency of data reading and writing.

According to the detection method in the example embodiment of the invention, the comparison coded data is directly obtained through the data mask interface 120, and such a data obtaining method is simpler and more efficient than obtaining data from an error checking and correction array and a storage area. In addition, correctness of the error correction coding logic is determined based on the checking comparison result of the target coded data and the comparison coded data, so that the correctness of the error correction coding logic in the error correction coding module can be tested quickly, which ensures that the target coded data generated by the error correction coding module can be used effectively for data error correction, and improves efficiency of data reading and writing.

It should be noted that although a plurality of modules or units of the detection circuit are described in detail above, such a division is not mandatory. Actually, based on the embodiments of the invention, features and functions of two or more modules or units described above may be embodied in one module or unit. Conversely, features and functions of one module or unit described above may be embodied in a plurality of modules or units through further division.

Figure 3:
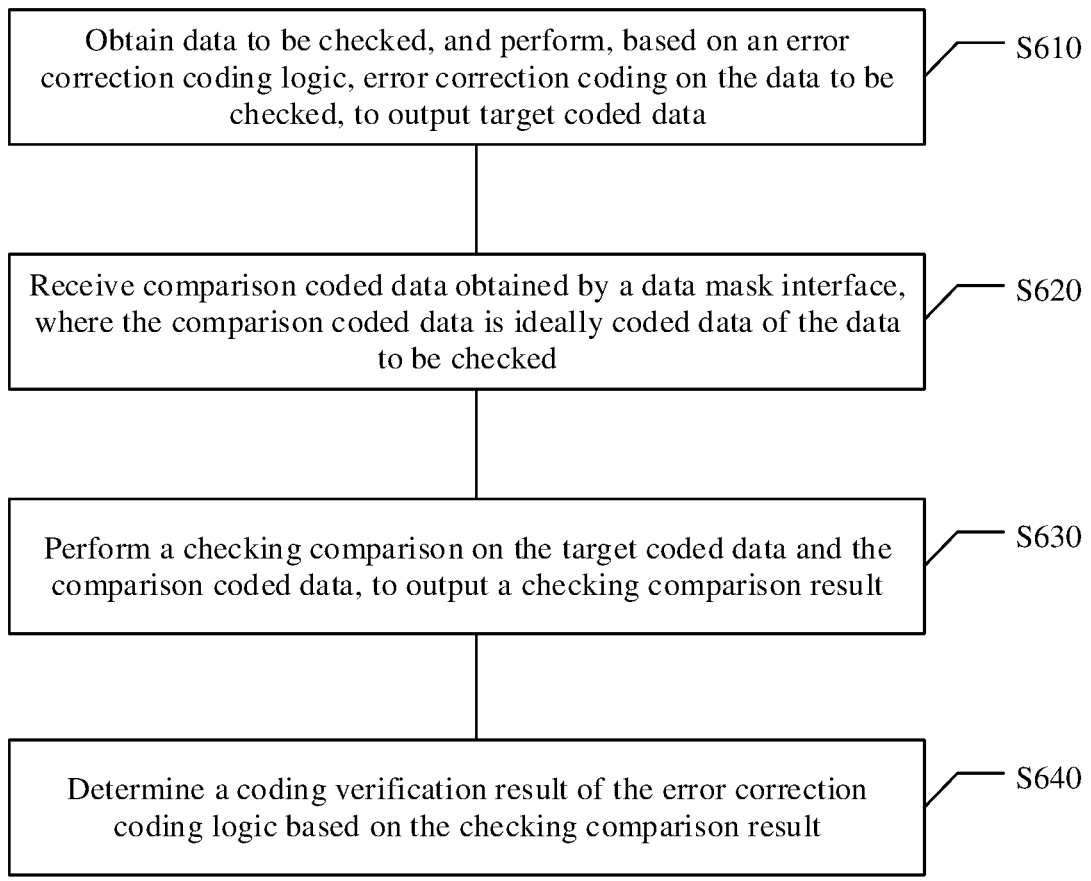
FIG. 3 schematically shows a flowchart of a detection method according to an example embodiment of the invention.

In addition, in this example embodiment, a detection method is further provided. The detection method of the invention may be implemented by using a server, or by using a terminal device. The terminal described herein may include a mobile terminal such as a mobile phone, a tablet computer, a notebook computer, a palmtop computer, a personal digital assistant (PDA), or a fixed terminal such as a desktop computer. FIG. 3 schematically shows a schematic flowchart of a detection method according to some embodiments of the invention. Referring to FIG. 3, the detection method may include the following steps:

Step S610: Obtain data to be checked, and perform, based on an error correction coding logic, error correction coding on the data to be checked, to output target coded data.

Step S620: Receive comparison coded data obtained by a data mask interface, where the comparison coded data is ideally coded data of the data to be checked.

Step S630: Perform a checking comparison on the target coded data and the comparison coded data, to output a checking comparison result.

Step S640: Determine a coding verification result of the error correction coding logic based on the checking comparison result.

Specific details of the detection method have been provided in the detailed description of the virtual modules of the corresponding detection circuit. Therefore, details are not described herein again.

It should be noted that although the various steps of the method of the invention are described in a specific order in the accompanying drawings, this does not require or imply that the steps must be performed in the specific order, or that all of the steps shown must be performed to achieve a desired result. Additionally or alternatively, some steps may be omitted, a plurality of steps may be combined and performed as one step, and/or one step may be split and performed as a plurality of steps, and so on.

In addition, in an example embodiment of the invention, an electronic device 700 capable of implementing the foregoing method is further provided.

Persons skilled in the art can understand that, the various aspects of the invention may be implemented as a system, method, or program product. Therefore, various aspects of the invention may be implemented in the form of hardware only embodiments, of software only embodiments, or of embodiments with a combination of software and hardware, which may be collectively referred to herein as a "circuit", "module", or "system".

The electronic device 700 according to this embodiment of the invention is described below with reference to FIG. 4. The electronic device 700 shown in FIG. 4 is merely an example, and shall not impose any limitation on the function and scope of use of the embodiments of the invention.

Figure 4:
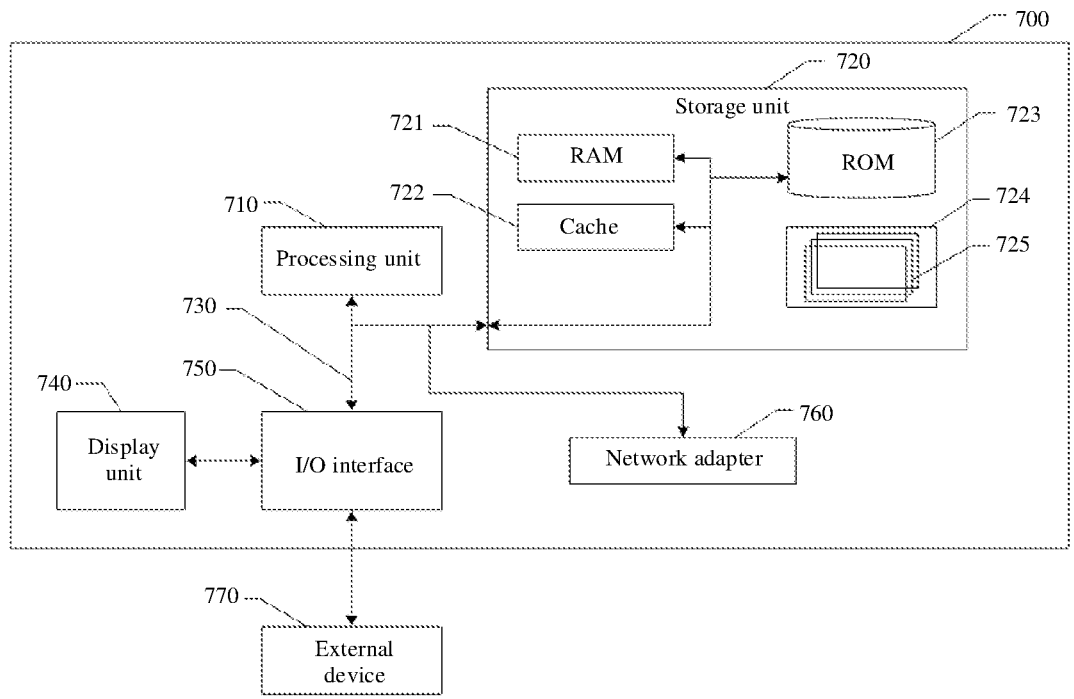
FIG. 4 schematically shows a block diagram of an electronic device according to an example embodiment of the invention.

As shown in FIG. 4, the electronic device 700 is represented in the form of a general-purpose computing device. Components of the electronic device 700 may include, but are not limited to: at least one processing unit 710, at least one storage unit 720, a bus 730 connecting different system components (including the storage unit 720 and the processing unit 710), and a display unit 740.

The storage unit 720 stores program code, which is executable by the processing unit 710 to cause the processing unit 710 to perform the steps according to various example embodiments of the invention described in the "example method" section of the description.

The storage unit 720 may include a readable medium in the form of a volatile storage unit, such as a random access memory (RAM) 721 and/or a cache 722, and may further include a read-only memory (ROM) 723.

The storage unit 720 may include a program/utility tool 724 having a set (at least one) of program modules 725 that includes but is not limited to: an operating system, one or more application programs, other program modules, and program data. Each or some combination of these examples may include an implementation of a network environment.

The bus 730 may represent one or more of a plurality of types of bus structures, including a memory bus or memory controller, a peripheral bus, an accelerated graphics port, a processing unit, or a local bus using any of the plurality of bus structures.

The electronic device 700 may also communicate with one or more external devices 770 (such as a keyboard, a pointing device, or a Bluetooth device), and may also communicate with one or more devices that enable a user to interact with the electronic device 700, and/or may communicate with any device (such as a router, or a modem) that enables the electronic device 700 to communicate with one or more other computing devices. Such communication may be performed through an input/output (I/O) interface 750. In addition, the electronic device 700 may also communicate with one or more networks (such as a local area network (LAN), a wide area network (WAN), and/or a public network such as the Internet) via a network adapter 760. As shown in the figure, the network adapter 760 communicates with other modules of the electronic device 700 through the bus 730. It should be understood that, although not shown in the figure, other hardware and/or software modules may be used in combination with the electronic device 700, including but not limited to: microcode, a device driver, a redundant processing unit, an external disk drive array, a RAID system, a tape driver, a data backup storage system, etc.

Through the foregoing description of the embodiments, persons skilled in the art may easily understand that the example embodiments described herein may be implemented by software, or may be implemented by software in combination with necessary hardware. Therefore, the technical solutions according to the embodiments of the invention may be implemented in the form of a software product. The software product may be stored in a non-volatile storage medium (which may be a CD-ROM, a USB flash drive, a removable hard disk, or the like) or on a network, and includes a plurality of instructions to cause a computing device (which may be a personal computer, a server, a terminal apparatus, a network device, or the like) to perform the method according to the embodiments of the invention.

In an example embodiment of the invention, a computer-readable storage medium is further provided, on which a program product capable of performing the foregoing method of the description is stored. In some possible embodiments, the various aspects of the invention may further be implemented in the form of a program product including program code for causing, when the program product is run on a terminal device, the terminal device to perform the steps according to various example embodiments of the invention described in the "example method" section of this description.

Figure 5:
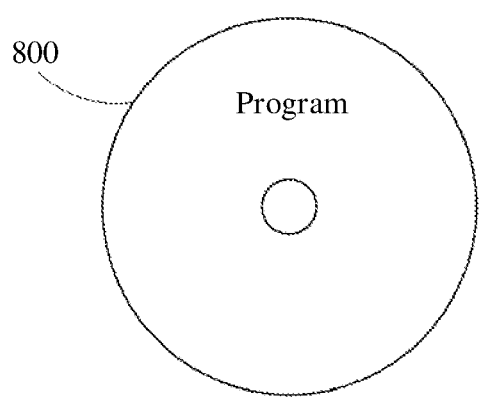
FIG. 5 schematically shows a schematic diagram of a computer-readable storage medium according to an example embodiment of the invention.

Referring to FIG. 5, a program product 800 for implementing the foregoing method according to an embodiment of the invention is described. The program product 800 may be a portable compact disk read-only memory (CD-ROM), and includes program code, and may be run on a terminal device, for example, a personal computer. However, the program product 800 of the invention is not limited thereto. The readable storage medium herein may be any tangible medium containing or storing a program which may be used by or in combination with an instruction execution system, apparatus, or device.

The program product 800 may be any combination of one or more readable media. The readable medium may be a readable signal medium or a readable storage medium. The readable storage medium may be, for example but not limited to, electric, magnetic, optical, electromagnetic, infrared, or semiconductor systems, apparatuses, or devices, or any combination thereof. More specific examples (non-exhaustive list) of the readable storage medium include: an electrical connection having one or more wires, a portable disk, a hard disk, a random access memory (RAM), a read-only memory (ROM), an erasable programmable read-only memory (EPROM or flash memory), an optical fiber, a portable compact disk read-only memory (CD-ROM), an optical storage device, a magnetic storage device, or any suitable combination thereof.

A computer-readable signal medium may include a data signal propagated in a baseband or as a part of a carrier, in which readable program code is carried. The propagated data signal may be in various forms, including but not limited to an electromagnetic signal, an optical signal, or any suitable combination thereof. The readable signal medium may also be any readable medium other than the readable storage medium. The readable medium can send, propagate, or transmit a program used by or in combination with an instruction execution system, apparatus, or device.

The program code contained in the readable medium may be transmitted by any suitable medium, including but not limited to wireless, wired, optical cable, radio frequency (RF), etc., or any suitable combination thereof.

The program code for performing operations of the invention can be written in one or more programming languages or any combination thereof, where the programming languages include object-oriented programming languages, such as Java and C++, and further include conventional procedural programming languages, such as "C" language or similar programming languages. The program code may be completely executed on a computing device of a user, partially executed on a user device, executed as an independent software package, partially executed on a computing device of a user and partially executed on a remote computing device, or completely executed on a remote computing device or server. In the circumstance involving a remote computing device, the remote computing device may be connected to a user's computing device over any type of network, including a local area network (LAN) or wide area network (WAN), or may be connected to an external computing device (for example, connected over the Internet using an Internet service provider).

In addition, the foregoing accompanying drawings are merely schematic illustrations of processes included in the method according to the example embodiments of the invention, and are not intended to be limiting. It is easily understood that the processes shown in the foregoing accompanying drawings do not indicate or are limited to a chronological sequence of these processes. In addition, it is also easily understood that these processes can be performed synchronously or asynchronously, for example, in a plurality of modules.

Persons skilled in the art may easily figure out other embodiments of the invention after considering the specification and practicing the invention disclosed herein. The invention is intended to cover any variations, purposes, or applicable changes of the invention. Such variations, purposes or applicable changes follow the general principle of the invention and include common knowledge or conventional technical means in the technical field which is not disclosed in the invention. The specification and embodiments are merely considered as examples, and the true scope and spirit of the invention are specified by the appended claims.

It should be understood that the invention is not limited to the exact structure that has been described above and shown in the accompanying drawings, and various modifications and changes may be made without departing from the scope of the invention. The scope of the invention is defined only by the appended claims.

What is claimed is:

1. A detection circuit comprising:
an error correction coding module configured to obtain data to be checked, and perform, based on an error correction coding logic, error correction coding on the data to be checked, to generate target coded data;
a data interface configured to receive comparison coded data, wherein the comparison coded data is obtained by coding the data to be checked with a correct version of the error correction coding logic to generate the comparison coded data;
a comparison checking module configured to perform a checking comparison on the target coded data and the comparison coded data to output a checking comparison result;
a logic verification module configured to: determine whether the target coded data and the comparison coded data are consistent, and in response to determining that the target coded data and the comparison coded data are consistent, determine that the error correction coding logic is correct; and
a data writing module configured to, in response to determining that the error correction coding logic is correct, write the target coded data to an error correction coding array.

2. The detection circuit according to claim 1, further comprising: a data obtaining module configured to obtain external original data through a data transmission interface, and replicate the external original data to generate the data to be checked, wherein the data to be checked has a preset length.

3. The detection circuit according to claim 2, wherein the data interface is a first data pad of a random access memory, and wherein the data transmission interface is a second data pad of the random access memory.

4. The detection circuit according to claim 1, wherein the detection circuit further comprises a comparison data generation module configured to:
obtain the comparison checking data; and
perform error correction coding on the comparison checking data based on the correct version of the error correction coding logic, to obtain the comparison coded data.

5. The detection circuit according to claim 4, wherein the comparison data generation module is further configured to:
obtain single-byte data, and determine a target quantity of replication times of the single-byte data based on a preset length of the data to be checked; and
replicate the single-byte data for the target quantity of replication times, to obtain the comparison checking data.

6. The detection circuit according to claim 1, wherein the comparison checking module comprises a comparison checking unit configured to:
perform consistency checking on the target coded data and the comparison coded data, to output a flag signal for representing the checking comparison result;
if the target coded data is consistent with the comparison coded data, determine the checking comparison result as a first comparison result, and output a first flag signal; and
if there is a difference between the target coded data and the comparison coded data, determine the checking comparison result as a second comparison result, and output a second flag signal.

7. The detection circuit according to claim 6, wherein the data writing module is configured to:
when the first flag signal is received, write the target coded data to the error correction coding array to generate array checking data, wherein the array checking data is used to check the data to be checked that is stored in a data array.

8. The detection circuit according to claim 7, wherein the logic verification module comprises a first verification unit configured to:
receive the second flag signal, and determine, under excitation of the second flag signal, whether the data to be checked is coded the same as the correctly coded data of the data to be checked.

9. The detection circuit according to claim 1, wherein the target coded data is a truth parity of the data to be checked, and wherein the comparison coded data is an expected parity of the data to be checked.

10. A method comprising:
obtaining data to be checked, and performing, based on an error correction coding logic, error correction coding on the data to be checked, to generate target coded data;
coding comparison checking data with a correct version of the error correction coding logic to generate comparison coded data, wherein a parameter of the comparison checking data is the same as a parameter of the data to be checked;
determining whether the target coded data and the comparison coded data are consistent;
in response to determining that the target coded data and the comparison coded data are consistent, determining that the error correction coding logic is correct; and
in response to determining that the error correction coding logic is correct, writing the target coded data to an error correction coding array.

11. An electronic device comprising:
a processor; and
a memory having non-transitory computer-readable instructions stored thereon, wherein when the computer-readable instructions are executed by the processor, the computer-readable instructions cause the processor to perform operations comprising:
obtaining data to be checked, and performing, based on an error correction coding logic, error correction coding on the data to be checked, to generate target coded data;
coding comparison checking data with a correct version of the error correction coding logic to generate comparison coded data, wherein a parameter of the comparison checking data is the same as a parameter of the data to be checked;
determining whether the target coded data and the comparison coded data are consistent;
in response to determining that the target coded data and the comparison coded data are consistent, determining that the error correction coding logic is correct; and
in response to determining that the error correction coding logic is correct, writing the target coded data to an error correction coding array.

12. A non-transitory computer-readable storage medium having a computer program stored thereon, wherein when the computer program is executed by a processor, the method according to claim 10 is implemented.

13. The method according to claim 10, further comprising: obtaining external original data through a data transmission interface, and replicating the external original data to generate the data to be checked, wherein the data to be checked has a preset length.

14. The method according to claim 10, further comprising:
obtaining the comparison checking data; and
performing error correction coding on the comparison checking data based on the correct version of the error correction coding logic to generate the comparison coded data.

15. The method according to claim 14, wherein:
obtaining the comparison checking data comprises obtaining single-byte data;
determining a target quantity of replication times of the single-byte data based on a preset length of the data to be checked; and
replicating the single-byte data for the target quantity of replication times to obtain the comparison checking data.

16. The method according to claim 10, wherein performing the consistency checking on the target coded data and the comparison coded data comprises;
if the target coded data is consistent with the comparison coded data, determining the checking comparison result as a first comparison result, and output a first flag signal; and
if there is a difference between the target coded data and the comparison coded data, determining the checking comparison result as a second comparison result, and output a second flag signal.

17. The method according to claim 16, further comprising:
  when the first flag signal is received, writing the target coded data to the error correction coding array to generate array checking data, wherein the array checking data is used to check the data to be checked that is stored in a data array.

18. The method according to claim 17, further comprising:
  determining, under excitation of the second flag signal, whether the data to be checked is coded the same as the correctly coded data of the data to be checked.

* * * * *